United States Patent
Yang

(10) Patent No.: US 6,787,903 B2
(45) Date of Patent: Sep. 7, 2004

(54) SEMICONDUCTOR DEVICE WITH UNDER BUMP METALLURGY AND METHOD FOR FABRICATING THE SAME

(75) Inventor: Ke-Chuan Yang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/337,622

(22) Filed: Jan. 7, 2003

(65) Prior Publication Data

US 2004/0092092 A1 May 13, 2004

(51) Int. Cl.[7] ................................................ H01L 29/40
(52) U.S. Cl. ...................... 257/734; 257/735; 257/736; 257/737
(58) Field of Search ................................ 257/734–737; 438/612

(56) References Cited

U.S. PATENT DOCUMENTS

| | | | |
|---|---|---|---|
| 5,773,359 A | 6/1998 | Mitchell et al. | 438/614 |
| 5,904,859 A | 5/1999 | Degani | 216/18 |
| 5,937,320 A | 8/1999 | Andricacos et al. | 438/614 |
| 5,946,590 A | * 8/1999 | Satoh | 438/613 |
| 6,492,197 B1 | * 12/2002 | Rinne | 438/108 |
| 6,492,198 B2 | * 12/2002 | Hwang | 438/108 |
| 6,586,323 B1 | * 7/2003 | Fan et al. | 438/614 |

* cited by examiner

*Primary Examiner*—Long Pham
*Assistant Examiner*—Nathan W. Ha
(74) *Attorney, Agent, or Firm*—Peter F. Corless; Steven M. Jensen; Edwards & Angell, LLP

(57) ABSTRACT

A semiconductor device with under bump metallurgy (UBM) and a method for fabricating the semiconductor device are provided, wherein a passivation layer is deposited on a surface of the semiconductor device where a plurality of bond pads are disposed, and formed with a plurality of openings for exposing the bond pads. A first metal layer is deposited over part of each of the bond pads and a portion of the passivation layer around the bond pad; then, a second metal layer is formed over the first metal layer and part of the bond pad uncovered by the first metal layer; subsequently, a third metal layer is formed over the second metal layer to thereby fabricate a UBM structure. Finally, a solder bump is formed on the UBM structure so as to achieve good bondability and electrical connection between the solder bump and UBM structure.

14 Claims, 6 Drawing Sheets

SEMICONDUCTOR DEVICE WITH UNDER BUMP METALLURGY AND METHOD FOR FABRICATING THE SAME

FIELD OF THE INVENTION

The present invention relates to semiconductor devices with under bump metallurgy (UBM) and fabrication methods thereof, and more particularly, to a flip-chip semiconductor device formed with UBM structures and a method for fabricating the semiconductor device.

BACKGROUND OF THE INVENTION

Flip-chip semiconductor packages employ advanced packaging technology that is characterized by mounting a semiconductor chip in a face-down manner on a substrate and electrically connecting the semiconductor chip to the substrate via a plurality of solder bumps. This structure yields significant benefits without having to use relatively space-occupying bonding wires for electrically connecting the semiconductor chip to the substrate, thereby making the overall package structure more compact in size.

Referring to FIG. 1, for forming a solder bump 150 to a semiconductor chip 100, the first step is to form an under bump metallurgy (UBM) structure 130 on a bond pad 110 of the semiconductor chip 100. The UBM structure 130 includes an adhesion layer 130a such as aluminum layer formed over the bond pad 110; a barrier layer 130b such as nickel/vanadium (Ni/V) alloy applied over the adhesion layer 130a; and a wetting layer 130c such as copper layer formed on the barrier layer 130b. A solder material can be applied over the wetting layer 130c and reflowed to form the solder bump 150 on the UBM structure 130. This UBM structure 130 serves as a diffusion barrier and provides proper adhesion between the solder bump 150 and the bond pad 110 of the semiconductor chip 100.

Fabrication of the UBM structure generally adopts sputtering, evaporation and plating processes.

FIGS. 2A to 2E illustrate conventional fabrication processes for a solder bump on a flip chip. Referring to FIG. 2A, the first step is to prepare a semiconductor chip 100 formed with a plurality of bond pads 110 on a surface thereof, and to apply a passivation layer 120 over the surface of the semiconductor chip 100. The passivation layer 120 is selectively removed to expose the bond pads 110 of the semiconductor chip 100. Then, sputtering and plating processes are performed to form a UBM structure 130 on each of the bond pads 110.

Referring to FIG. 2B, next, a solder mask film 140 such as dry film is applied over the passivation layer 120 and formed with a plurality of openings 141 for exposing the UBM structures 130.

Referring to FIG. 2C, then a solder-applying process is performed by which a solder paste such as tin/lead (Sn/Pb) alloy is applied via the openings 141 through the use of screen-printing technology over the UBM structures 130 to form a plurality of solder bumps 150 respectively on the UBM structures 130.

Referring to FIG. 2D, a first reflow process is carried out to bond the solder bumps 150 to the corresponding UBM structures 130. Then, the solder mask layer 140 is removed, and a second reflow process is performed to make the solder bumps 150 have a ball shape, as shown in FIG. 2E.

Prior art references relating to UBM technology include, for example, U.S. Pat. No. 5,773,359 entitled "Interconnect System and Method of Fabrication", U.S. Pat. No. 5,904,859 entitled "Flip Chip Metallization", and U.S. Pat. No. 5,937,320 entitled "Barrier Layers for Electroplated SnPb Eutectic Solder Joints"; to name just a few.

In respect of fabricating a UBM structure on an aluminum-made bond pad (hereinafter referred to as "aluminum pad") of a semiconductor chip, an aluminum layer (or a chromium layer) is firstly formed over the aluminum pad to provide adhesion between the aluminum pad and the UBM structure. Then, a nickel/vanadium (Ni/V) layer is deposited over the aluminum layer to serve as a barrier for preventing intermetallic compounds formed from reaction between the aluminum pad and a solder-bump electrode. Finally, a copper layer (or a layer made of nickel, palladium or molybdenum) is applied on the Ni/V layer for allowing the solder bump to be successfully bonded to the UBM structure. However, this UBM structure is not applicable to a copper-made bond pad (hereinafter referred to as "copper pad") because the aluminum layer formed over the bond pad has relatively poor adhesion to copper, making the UBM structure not strongly bonded to the copper pad. Therefore, for forming a UBM structure on a copper pad, the first step is to apply a titanium (Ti) layer over the copper pad, and the Ti layer provides good adhesion between the UBM structure and the copper pad. Then, a Ni/V layer and a copper layer are formed over the Ti layer for allowing a solder bump to be strongly bonded thereon. Although the Ti layer enhances adhesion between the copper pad and the UBM structure, this Ti layer is poorer in electrical conductivity than aluminum and thus degrades electrical connection between the solder bump and the copper pad.

Therefore, the problem to be solved herein is to provide good electrical connection and adhesion between a UBM structure and a copper-made bond pad.

SUMMARY OF THE INVENTION

A primary objective of the present invention is to provide a semiconductor device with under bump metallurgy (UBM) and a method for fabricating the same, so as to effectively improve electrical connection between a UBM structure and a bond pad of the semiconductor device.

Another objective of the invention is to provide a semiconductor device with under bump metallurgy and a method for fabricating the same, which can greatly enhance adhesion between a UBM structure and a bond pad or a passivation layer of the semiconductor device.

In accordance with the foregoing and other objectives, the present invention proposes a semiconductor device with under bump metallurgy (UBM), comprising: a device body having at least a surface formed with a plurality of bond pads thereon; a passivation layer applied over the surface of the device body and formed with a plurality of openings for exposing the bond pads via the openings; a plurality of UBM structures, each of which includes a first metal layer for covering part of each of the bond pads and a portion of the passivation layer around the corresponding bond pad, a second metal layer for covering the first metal layer and part of the bond pad uncovered by the first metal layer, and at least a third metal layer applied over the second metal layer; and a plurality of solder bumps formed on the UBM structures respectively.

A method for fabricating the semiconductor device with under bump metallurgy of the invention comprises the steps of: applying a passivation layer over at least a surface of a device body formed with a plurality of bond pads thereon, wherein the passivation layer is formed with a plurality of openings for exposing the bond pads via the openings; forming a first metal layer (such as a titanium layer) over part of each of the bond pads and a portion of the passivation layer around the corresponding bond pad; applying a second metal layer (such as a copper layer) over the first metal layer and part of the bond pad uncovered by the first metal layer; applying at least a third metal layer (such as a nickel layer) over the second metal layer, and forming a solder bump on the UBM structure.

The above semiconductor device with under bump metallurgy (UBM) is characterized in that the first metal layer (titanium layer) of the UBM structure only covers partly the bond pad and the passivation layer around the bond pad, thereby assuring good adhesion between the UBM structure and the bond pad and passivation layer. Moreover, with the bond pad being only partly covered by the first metal layer, the second metal layer (copper layer) subsequently formed on the first metal can directly come into contact with the copper-made bond pad, so as to provide good electrical connection between the UBM structure and the bond pad.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
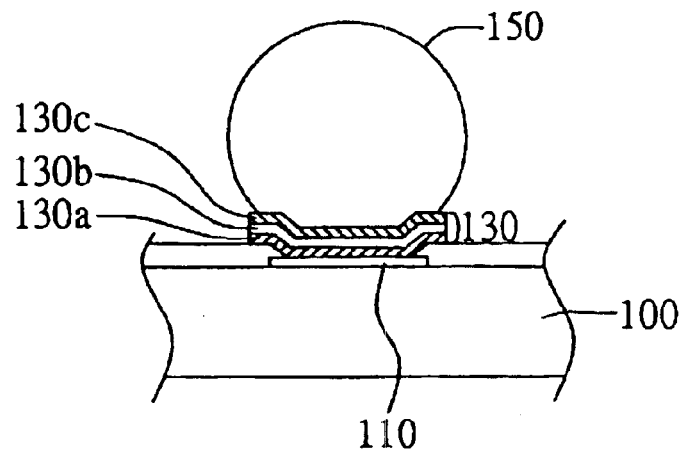
FIG. 1 (PRIOR ART) is a cross-sectional view of a conventional under bump metallurgy (UBM) structure.
Figure 2A:
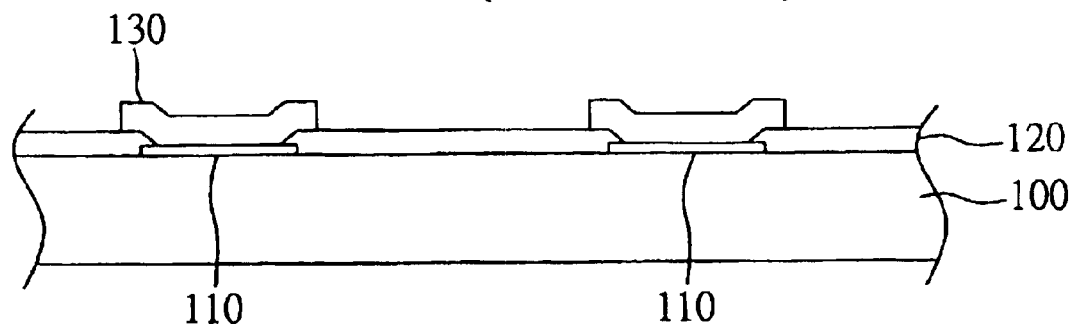
FIGS. 2A–2E (PRIOR ART) are cross-sectional diagrams showing conventional fabrication processes for forming a solder bump on a flip chip.
Figure 2B:
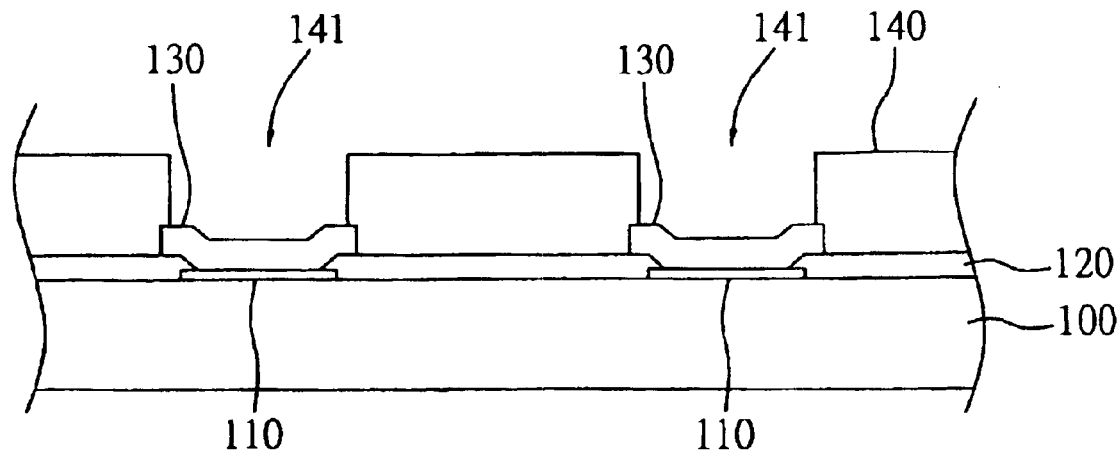
Figure 2C:
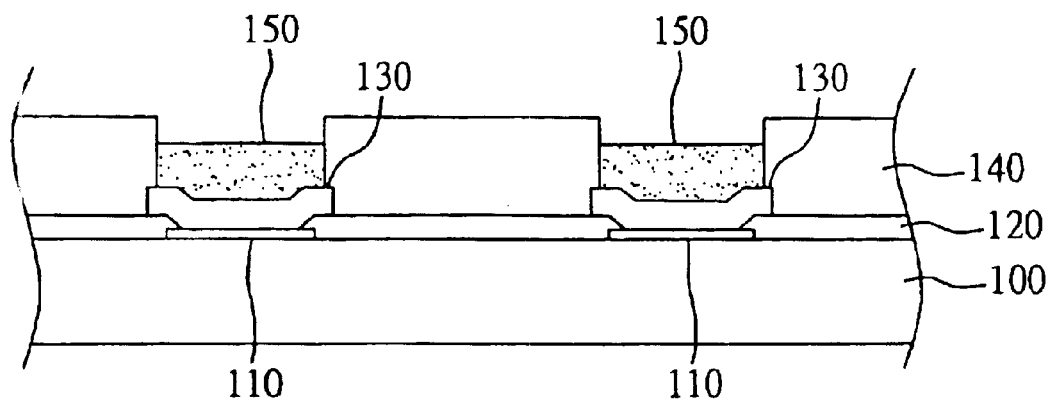
Figure 2D:
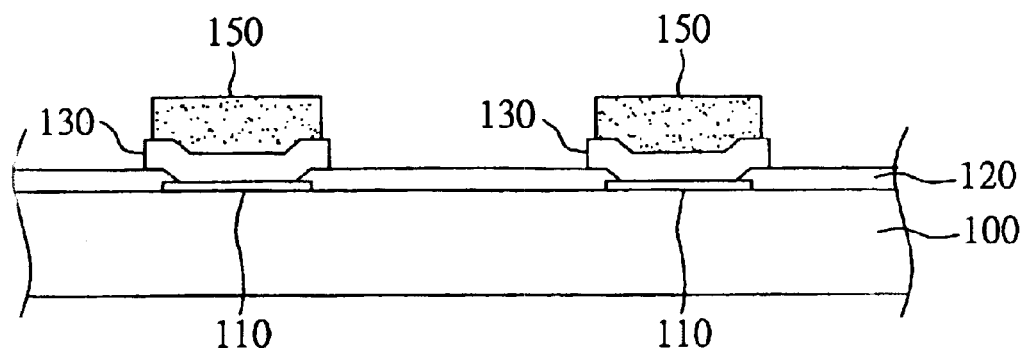
Figure 2E:
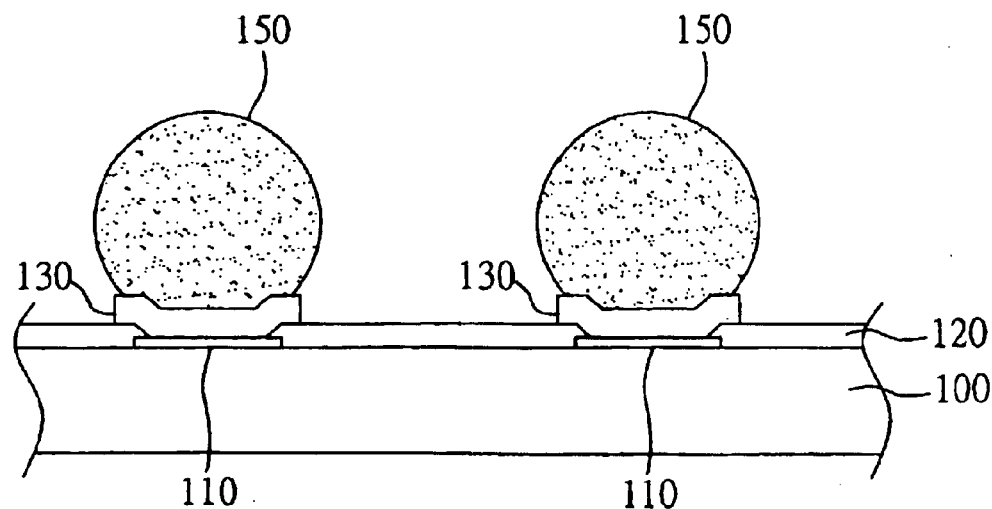
Figure 3A:
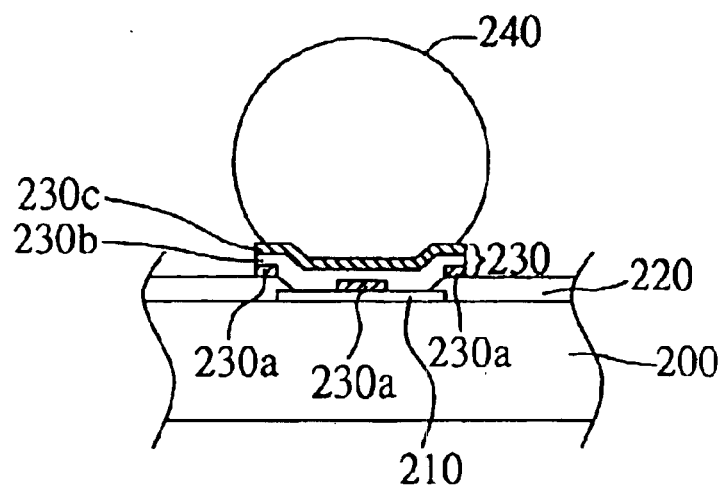
FIG. 3A is a cross-sectional view of a semiconductor device with under bump metallurgy according to a first preferred embodiment of the invention.

FIG. 3A illustrates a cross-sectional view of a semiconductor device with under bump metallurgy (UBM) according to a first preferred embodiment of the present invention.

This semiconductor device is composed of a device body 200 formed with a plurality of bond pads 210 on at least a surface thereof; a passivation layer 220 applied over the surface of the device body 200 and formed with a plurality of openings for exposing the bond pads 210 via the openings; a plurality of UBM structures 230 respectively formed on the exposed bond pads 210, wherein each of the UBM structures 230 includes a first metal layer 230a for covering part of the corresponding bond pad 210 and a portion of the passivation layer 220 around the bond pad 210, a second metal layer 230b for covering the first metal layer 230a and part of the bond pad 210 uncovered by the first metal layer 230a, and at least a third metal layer 230c applied over the second metal layer 230b; and a plurality of solder bumps 240 formed on the UBM structures 230 respectively.

The device body 200 can be a substrate used in a semiconductor package, or a printed circuit board (PCB) for accommodating electronic elements; preferably, the device body 200 is a semiconductor chip or wafer for a flip-chip structure. The plurality of bond pads 210 formed on the device body 200 can be e.g. copper pads acting as input/output (I/O) pads of the device body 200. For the sake of simplicity, only one bond pad is illustrated in the drawings for the following description.

The passivation layer 220 is a dielectric layer generally made of polyimide, silicon dioxide, silicon nitride, etc. The passivation layer 220 covers the surface of the device body 200 formed with the bond pads 210 and protects the surface against external contamination and damage. Moreover, the passivation layer 220 is formed with a plurality of openings for exposing the bond pads 210 via the openings.

Figure 3B:
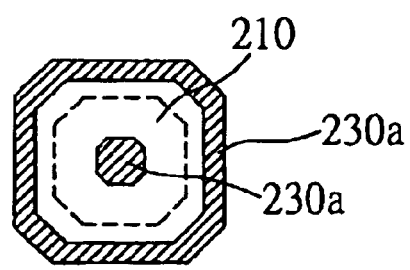
FIGS. 3B and 3C are each a top view of a first metal layer formed in the semiconductor device with under bump metallurgy shown in FIG. 3A.
Figure 3C:
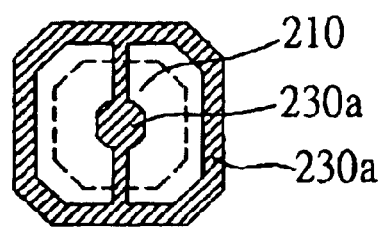

The UBM structure 230 is composed of a plurality of metal layers formed on each of the bond pads 210. For use with a copper-made bond pad 210, first, a first metal layer 230a such as a titanium (Ti) layer is applied over the bond pad 210 and provides good adhesion between the UBM structure 230 and the bond pad 210. This first metal layer 230a covers a central portion of the bond pad 210 and a portion of the passivation layer 220 around the bond pad 210, making an annular portion of the bond pad 210 and a side edge of the passivation layer 220 around the bond pad 210 exposed to outside of the first metal layer 230a, as shown in FIG. 3B. Moreover, for enhancing adhesion between the first metal layer 230a and the bond pad 210 or passivation layer 220, as shown in FIG. 3C, at least a connecting portion can be formed to interconnect portions of the first metal layer 230a respectively covering the central portion of the bond pad 210 and the portion of the passivation layer 220; this connecting portion is not particularly limited in metal material for making the same and in shape or quantity thereof.

The UBM structure 230 also includes a second metal layer 230b such as a copper layer, which is formed over the first metal layer 230a for covering the first metal layer 230a and the exposed annular portion of the bond pad 210, wherein the second metal layer (copper layer) 230b directly comes into contact with the copper-made bond pad 210 to thereby provide good electrical connection between the UBM structure 230 and the bond pad 210. The UBM structure 230 may further include a third metal layer 230a such as a nickel layer formed over the second metal layer 230b. This third metal layer 230c provides satisfactory protection for the second metal layer 230b and good wetting effect for a solder bump 240 subsequently bonded to the third metal layer 230c, so as to allow the solder bump 240 to be well connected to the UBM structure 230.

Figure 4A:
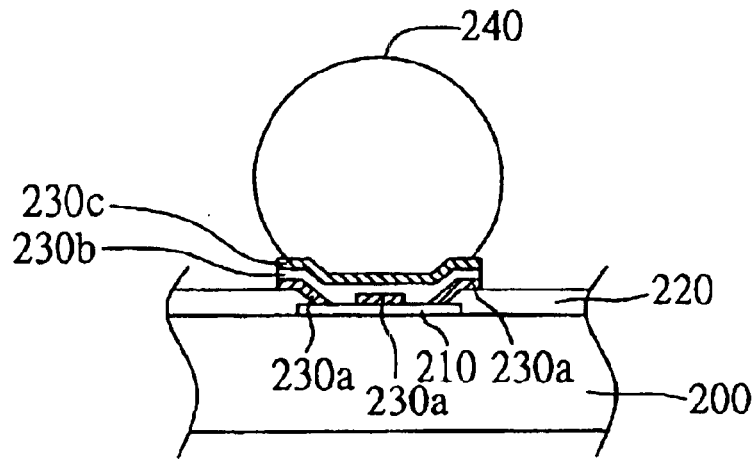
FIG. 4A is a cross-sectional view of a semiconductor device with under bump metallurgy according to a second preferred embodiment of the invention.
Figure 4B:
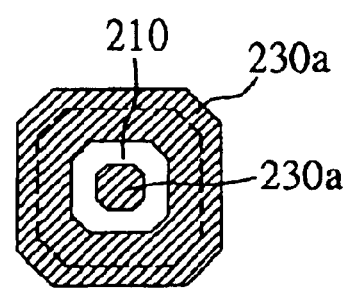
FIGS. 4B and 4C are each a top view of a first metal layer formed in the semiconductor device with under bump metallurgy shown in FIG. 4A.
Figure 4C:
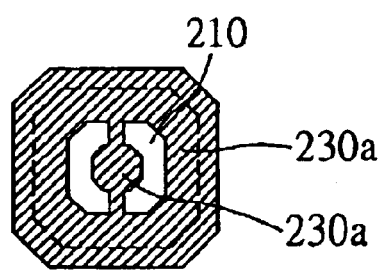

FIG. 4A illustrates a semiconductor device with under bump metallurgy according to a second preferred embodiment of the invention. As shown in the drawing, this semiconductor device is structurally similar to but differs from the above semiconductor device of the first preferred embodiment in that, in the second embodiment, the first metal layer (titanium layer) 230a covers the central portion of the bond pad 210 and the portion and side edge of the passivation layer 220 around the bond pad 210, only allowing the annular portion of the bond pad 210 to be exposed, as shown in FIG. 4B. This increases applied area of the first metal layer 230a to thereby enhance adhesion between the UBM structure 230 and the bond pad 210 and passivation layer 220. Moreover, at least a connecting portion of the first metal layer 230a can be formed across the exposed annular portion of the bond pad 210, as shown in FIG. 4C.

FIGS. 5A to 5E illustrate fabrication processes for fabricating the semiconductor device with under bump metallurgy according to the second preferred embodiment of the invention.

Figure 5A:
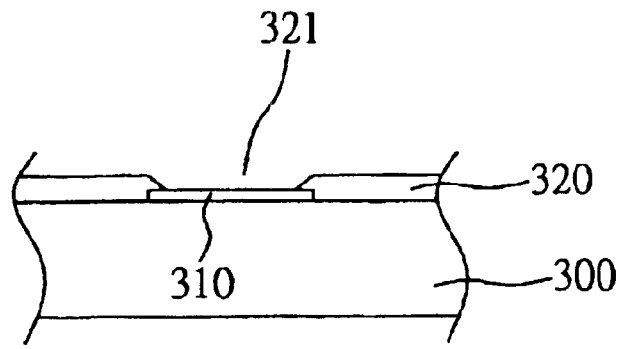
FIGS. 5A–5E are cross-sectional diagrams showing fabrication processes for fabricating the semiconductor device with under bump metallurgy according to the invention.

Referring to FIG. 5A, the first step is to apply a passivation layer 320 such as a silicon-dioxide layer over a surface of a semiconductor chip 300 formed with a plurality of copper-made bond pads 310 thereon, wherein the passivation layer 320 is formed with a plurality of openings 321 for exposing the bond pads 310 via the openings 321.

Figure 5B:
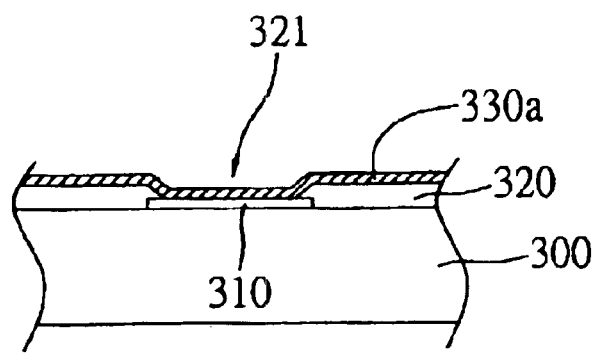

Referring to FIG. 5B, the next step is to perform a sputtering process to form a first metal layer 330a such as a titanium layer of a UBM structure 330 over the passivation layer 320 and the exposed bond pads 310.

Figure 5C:
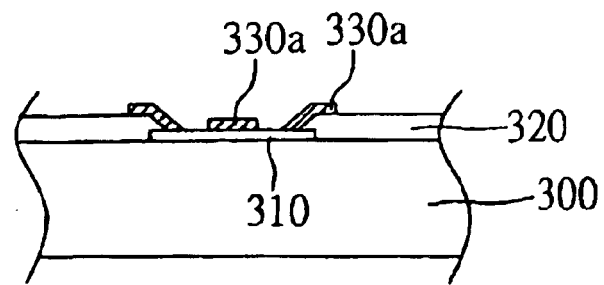

Referring to FIG. 5C, an etching process is performed to selectively remove the first metal layer 330a, so as to form a pattern of the first metal layer 330a (as shown in FIG. 4B) that covers part of each of the bond pads 310 and a portion of the passivation layer 320 around the corresponding bond pad 310. By good adhesion between the first metal layer (titanium layer) 330a and the copper-made bond pad 310, it assures satisfaction connection between the UBM structure 330 and the bond pad 310.

Figure 5D:
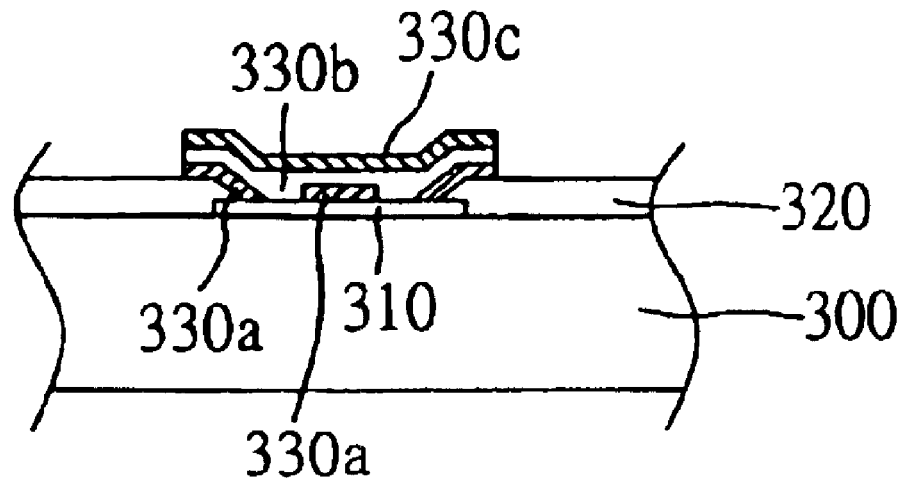

Referring to FIG. 5D, after completing patterning of the first metal layer 330a, a second metal layer (such as a copper layer) 330b and a third metal layer (such as a nickel layer 330c) are plated over the first metal layer 330a. The second metal layer 330b covers the first metal layer 330a and part of the bond pad 310 uncovered by the first metal layer 330a, allowing the second metal layer 330b to be in direct contact with the copper-made bond pad 310. Then, the third metal layer 330c is formed over the second metal layer 330b, and completes fabrication of the UBM structure 330.

Figure 5E:
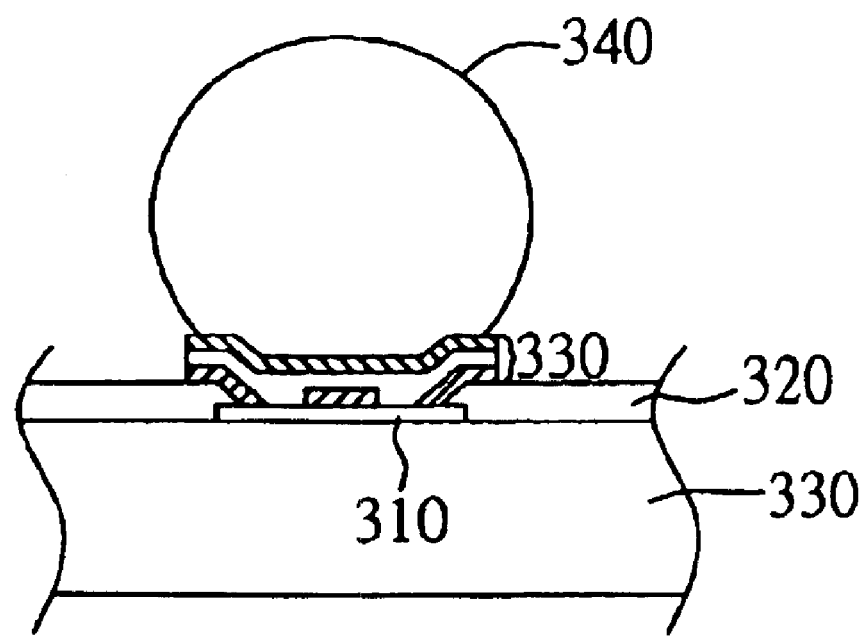

Referring to FIG. 5E, finally a solder material is applied over the third metal layer 330c and reflowed to form a solder bump 340 on the UBM structure 330. This thereby completes fabrication of the semiconductor device with under bump metallurgy (UBM).

The above UBM structure provides significant benefits. The first metal layer (titanium layer) partly covers both the bond pad and the passivation layer around the bond pad, thereby assuring good adhesion between the UBM structure and the bond pad and passivation layer. Moreover, with the bond pad being only partly covered by the first metal layer, the second metal layer (copper layer) subsequently formed on the first metal can directly come into contact with the copper-made bond pad, so as to provide good electrical connection between the UBM structure and the bond pad.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device with under bump metallurgy, comprising:

a device body having at least a surface formed with a plurality of bond pads thereon;

a passivation layer applied over the surface of the device body and formed with a plurality of openings for exposing the bond pads via the openings;

a plurality of under bump metallurgy (UBM) structures, each of which includes a plurality of metal layers, wherein a first metal layer covers part of each of the bond pads and a portion of the passivation layer around the corresponding bond pad, and a second metal layer of the UBM structure covers the first metal layer and part of the bond pad uncovered by the first metal layer; and a plurality of solder bumps formed on the UBM structures respectively.

2. The semiconductor device with under bump metallurgy of claim 1, wherein the UBM structure further comprises at least a third metal layer formed over the second metal layer.

3. The semiconductor device with under bump metallurgy of claim 1, wherein the device body is selected from the group consisting of a semiconductor chip, wafer, substrate and circuit board.

4. The semiconductor device with under bump metallurgy of claim 1, wherein the bond pads are made of copper.

5. The semiconductor device with under bump metallurgy of claim 1, wherein the first metal layer is made of titanium.

6. The semiconductor device with under bump metallurgy of claim 1, wherein the second metal layer is made of copper.

7. The semiconductor device with under bump metallurgy of claim 2, wherein the third metal layer is made of nickel.

8. The semiconductor device with under bump metallurgy of claim 1, wherein the passivation layer is a dielectric layer.

9. The semiconductor device with under bump metallurgy of claim 8, wherein the passivation layer is made of a material selected from the group consisting of polyimide, silicon dioxide and silicon nitride.

10. The semiconductor device with under bump metallurgy of claim 1, wherein the first metal layer covers a central portion of each of the bond pads and a portion of the passivation layer around each bond pad.

11. The semiconductor device with under bump metallurgy of claim 10, wherein the first metal layer further includes a connecting portion for interconnecting portions of the first metal layer covering the central portion of each bond pad and the portion of the passivation layer.

12. The semiconductor device with under bump metallurgy of claim 1, wherein the first metal layer covers a central portion of each of the bond pads and a side edge of the passivation layer around each bond pad, allowing only an annular portion of each bond pad to be exposed.

13. The semiconductor device with under bump metallurgy of claim 12, wherein the first metal layer further includes a connecting portion formed across to annular portion of each bond pad.

14. The semiconductor device with under bump metallurgy of claim 1, wherein the first metal layer further includes a connecting portion for interconnecting portions of the first metal layer covering part of each of the bond pads and the portion of the passivation layer around the corresponding bond pad.

* * * * *